United States Patent
Syed

(10) Patent No.: US 8,441,173 B2
(45) Date of Patent: May 14, 2013

(54) WAKE-UP UNIT FOR WAKING UP AN ELECTRONIC DEVICE AND METHOD OF WAKING UP AN ELECTRONIC DEVICE

(75) Inventor: Aly Aamer Syed, Deurne (NL)

(73) Assignee: NXP B.V., Eindhoven (NL)

( * ) Notice: Subject to any disclaimer, the term of this patent is extended or adjusted under 35 U.S.C. 154(b) by 223 days.

(21) Appl. No.: 12/937,825

(22) PCT Filed: Apr. 16, 2009

(86) PCT No.: PCT/IB2009/051584
§ 371 (c)(1),
(2), (4) Date: Oct. 14, 2010

(87) PCT Pub. No.: WO2009/128041
PCT Pub. Date: Oct. 22, 2009

(65) Prior Publication Data
US 2011/0031846 A1 Feb. 10, 2011

(30) Foreign Application Priority Data
Apr. 16, 2008 (EP) .................................... 08103560

(51) Int. Cl.
*H01L 41/08* (2006.01)
(52) U.S. Cl.
USPC ........................................................ 310/339
(58) Field of Classification Search .............. 310/321, 310/339
See application file for complete search history.

(56) References Cited

U.S. PATENT DOCUMENTS

| | | | | |
|---|---|---|---|---|
| 4,467,236 | A * | 8/1984 | Kolm et al. | 310/321 |
| 4,612,472 | A * | 9/1986 | Kakizaki et al. | 310/339 |
| 5,569,187 | A * | 10/1996 | Kaiser | 604/67 |
| 5,801,475 | A * | 9/1998 | Kimura | 310/319 |
| 6,452,499 | B1 * | 9/2002 | Runge et al. | 340/601 |
| 6,577,559 | B1 * | 6/2003 | Fleury et al. | 368/250 |
| 7,116,035 | B2 * | 10/2006 | Sugawara | 310/322 |
| 7,122,944 | B2 * | 10/2006 | Grimshaw | 310/339 |
| 7,248,146 | B1 | 7/2007 | Kammer et al. | |
| 7,467,034 | B2 * | 12/2008 | Breed et al. | 701/29.6 |
| 7,541,720 | B2 * | 6/2009 | Clingman et al. | 310/339 |
| 7,687,977 | B2 * | 3/2010 | Xu | 310/339 |

(Continued)

FOREIGN PATENT DOCUMENTS

| | | |
|---|---|---|
| FR | 2 661 535 A1 | 10/1991 |
| GB | 1 412 466 A | 11/1975 |

(Continued)

OTHER PUBLICATIONS

International Search Report and Written Opinion for Int'l. Patent Application No. PCT/IB2009/051584 (Apr. 16, 2009).

*Primary Examiner* — Mark Budd

(57) ABSTRACT

A wake-up unit for waking up an electronic device is provided. The wake-up unit comprises a resonating unit (C) for resonating at least one specific frequency, at least one first electrode (TE), at least one piezoelectric material (PM) and at least one second electrode (BE). The piezoelectric material (PM) is sandwiched between the at least one first and the at least one second electrode (TE, BE) such that an electronic current is provided to the at least one first and at least one second electrode (TE, BE) when the resonating unit (C) resonates at the at least one specific frequency.

15 Claims, 3 Drawing Sheets

U.S. PATENT DOCUMENTS

| | | | |
|---|---|---|---|
| 7,713,200 B1 * | 5/2010 | Sarvazyan et al. | 600/437 |
| 7,898,157 B2 * | 3/2011 | Churchill et al. | 310/339 |
| 2002/0030603 A1 | 3/2002 | Amano et al. | |
| 2003/0173829 A1 | 9/2003 | Zeng | |
| 2004/0183148 A1 | 9/2004 | Blasko | |
| 2007/0013523 A1 | 1/2007 | Paradiso et al. | |
| 2007/0063621 A1 * | 3/2007 | Haswell et al. | 310/339 |
| 2007/0125176 A1 * | 6/2007 | Liu | 73/649 |
| 2008/0129147 A1 * | 6/2008 | Thiesen et al. | 310/319 |

FOREIGN PATENT DOCUMENTS

| | | |
|---|---|---|
| GB | 1 437 355 A | 5/1976 |
| GB | 1 451 787 A | 10/1976 |
| KR | 20010091963 A | 10/2001 |
| WO | 03/026146 A1 | 3/2003 |
| WO | 2005/009535 A | 2/2005 |
| WO | 2006/046937 A | 5/2006 |
| WO | 2007/056473 A2 | 5/2007 |

* cited by examiner

WAKE-UP UNIT FOR WAKING UP AN ELECTRONIC DEVICE AND METHOD OF WAKING UP AN ELECTRONIC DEVICE

FIELD OF THE INVENTION

The present invention relates to a wake-up device for waking up an electronic device as well as to a method for waking up an electronic device.

BACKGROUND OF THE INVENTION

Modern electronic devices typically have a stand-by mode such that they can be quickly and conveniently activated for example by means of a remote control. In the stand-by mode, a part of the electronic device is typically actively listening for a wake-up signal which may originate from a remote control or from a button press in or on the electronic device. In the stand-by mode, typically a large part of the electronic device is deactivated and does not consume energy. Merely the actively listening part of the electronic device will consume energy. This actively listening part can be considered as a wake-up unit of the electronic device. When this wake-up unit receives a wake-up signal from the remote control, it will activate other parts of the electronic device such that the electronic device will change into its normal operating mode.

US 2004/0183148 A1 discloses an integrated circuit with power save switches which comprise micro-electromechanical systems. The MEMS are used to disconnect at least part of the integrated circuit from a power supply and to connect the parts again to the power supply.

SUMMARY OF THE INVENTION

It is therefore an object of the invention to provide a wake-up unit for an electronic device as well as a method for waking up electronic devices with a reduced power consumption.

This object is solved by a wake-up unit for an electronic device according to claim 1 and a method of waking up an electronic device according to claim 6.

Therefore, a wake-up unit for waking up an electronic device is provided. The wake-up unit comprises a resonating unit for resonating at least one specific frequency, at least one first electrode, at least one piezoelectric material and at least one second electrode. The piezoelectric material is sandwiched between the at least one first and the at least one second electrode such that an electronic current is provided to the at least one first and at least one second electrode when the resonating unit resonates at the at least one specific frequency.

According to an aspect of the invention, the resonating comprises at least one cantilever which resonates when it receives an ultra-sound wake-up signal at the at least one specific frequency. Accordingly, by receiving the ultra-sound wake-up signal, the cantilever will resonate such that an electronic current is provided at the first and second electrode which could be used to wake-up or activate an electronic device.

According to a further aspect of the invention, the resonating unit comprises a plurality of cantilevers which each resonate at a different specific frequency such that an electrical current can be provided at the first and second electrode if the wake-up unit receives more than one specific frequency.

According to an aspect of the invention, the first and second electrode, the piezoelectric material and the resonating unit are implemented as a micro-electromechanical system MEMS.

The invention also relates to an electric device which comprises a wake-up unit as described above. The current generated by the wake-up unit is used to activate at least parts of the electronic device.

The invention also relates to a method for waking up an electronic device which comprises a resonating unit, at least one first electrode, at least one piezoelectric material and at least one second electrode. The piezoelectric material is sandwiched between the at least one first and the at least one second electrode. When the resonating unit receives a signal at least one specific frequency, it will resonate and an electrical current is provided to the first and second electrode.

The invention relates to the idea to use a wake-up device based on micro-electric mechanical systems MEMS. As the proposed MEMS system does not require an electrical current to receive a wake-up signal, the energy consumption thereof will be very low or not existing. By receiving a mechanical or sonic signal, the MEMS unit will be activated and the electronic device will be woken up or activated. In particular, the MEMS will only produce a current when it has been activated by a mechanical or sonic signal.

Further aspects of the invention are defined in the dependent claims.

BRIEF DESCRIPTION OF THE DRAWINGS

The advantages and embodiments of the invention are now described in more detail with reference to the Figures.

DETAILED DESCRIPTION OF EMBODIMENTS

Figure 1:
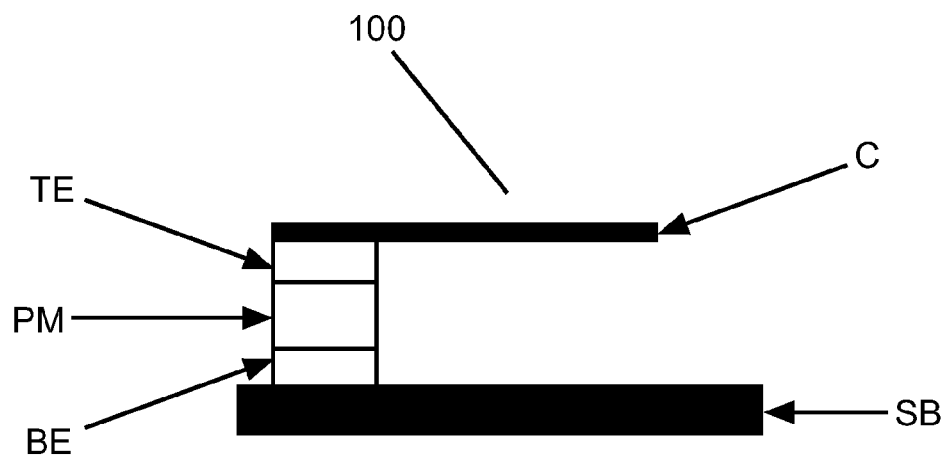
FIG. 1 shows a basic representation of a micro-electro mechanical system as part of a wake-up unit according to a first embodiment.

FIG. 1 shows a representation of wake-up unit according to a first embodiment. The wake-up unit is based on a micro-electro mechanical system MEMS. The micro-electro mechanical system 100 comprises a substrate bulk SB, a bottom electrode BE, a piezoelectric material PM, a top electrode TE and a cantilever C. Accordingly, the cantilever is the resonating element that can resonate at an audio frequency, preferably in the ultra-sound domain. The resonating element, i.e. the cantilever C, is coupled to a piezoelectric element with a top electrode TE, the piezoelectric material PM and the bottom electrode BE. When the cantilever is excited, e.g. as it receives an audio signal at its resonating frequency, the piezoelectric element will generate a current. This generated current can be used to wake-up or start up an electronic device coupled to the wake-up unit.

In other words, the cantilever C receives an acoustic excitation and vibrates. This vibration is supplied to the piezoelectric material such that a current is generated.

Figure 2:
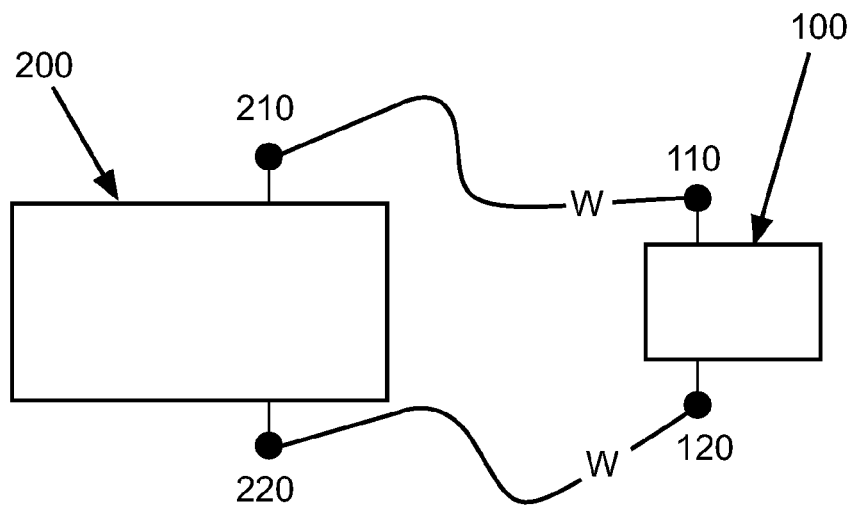
FIG. 2 shows a basic representation of a wake-up unit and an electronic device according to a second embodiment.

FIG. 2 shows a basic representation of a wake-up unit and an electronic device. The wake-up unit 100 comprises a first and second electrode 110, 120 which may correspond to the top electrode TE and the bottom electrode BE according to the first embodiment. The first and second electrode of the wake-up unit are coupled to a first and second electrode 210, 220 of an electronic device 200. When the wake-up unit 100 receives a wake-up signal (mechanically or acoustically) it generates a current which is transferred via its first and second electrode 110, 120 over the wires W to the first and second electrode 210, 220 of the electronic device 200. In other words, the wake-up device converts a mechanical or acoustic signal into an electric current which can be used to start up or wake up the electronic device 200. As the wake-up unit does not comprise any electrically active listening units, the power consumption thereof during the stand-by mode is very low or not existing.

Figure 3:
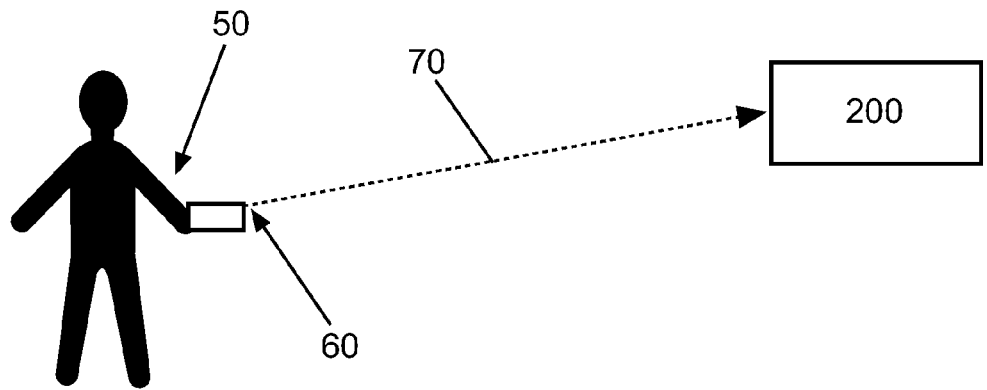
FIG. 3 shows a representation of an environment according to a third embodiment.

FIG. 3 shows a basic representation of an environment according to a third embodiment. Here, a user 50 with a remote control 60 as well as an electronic device 200 is depicted. By activating the remote control, an ultra-sound or ultra-sonic signal 70 is emitted by the remote control 60. The electronic device 200 may receive the ultra-sonic signal 70. The electronic device 200 may comprise a wake-up unit 100 according to the first or second embodiment. When the wake-up unit receives the ultra-sound wake-up signal 70, it will produce an electric current which is supplied to the electronic device such that the electronic device can wake-up.

The remote control 60 can be implemented as a typical handheld remote control, as part of a handheld device, or the remote control can be for example be implemented as a control panel which could be attached to a wall. In other words, the remote control is a device which can send a wake-up signal when a button is pressed or activated.

The cantilever C which is used as a resonating unit can be implemented such that it resonates at different frequencies. This can for example be performed by changing the mass of the cantilever C appropriately. Alternatively, the resonating unit may also comprise several cantilevers which resonate at different frequencies. Therefore, each cantilever may be tuned to a specific frequency such that it will only then start to resonate or vibrate when it receives a wake-up signal at this specific frequency. By providing wake-up units with different cantilevers, each wake-up device can be activated individually by a specific wake-up signal. Accordingly, each electronic device coupled to the wake-up unit can be activated individually.

Figure 4:
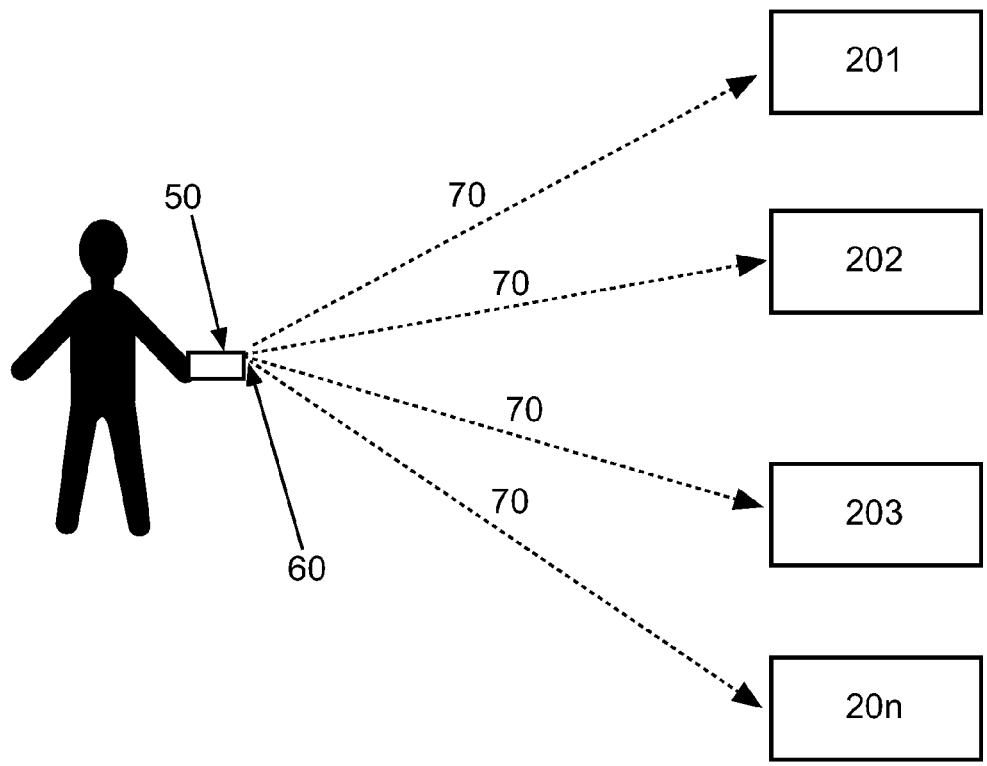
FIG. 4 shows a basic representation of an environment according to a fourth embodiment.

FIG. 4 shows a basic representation of an environment with several electronic devices. Here, again a user 50 with a remote control 60 is depicted. The remote control may be adapted to output an ultra-sonic wake-up signal 70. Furthermore, a plurality of electronic devices 201-20$n$ is present. Each of these devices 201-20$n$ will receive the ultra-sonic waking up 70. However, only one of the wake-up units in the electronic devices 201-20$n$ will be tuned to the frequency of the transmitted ultra-sound waking up signal 70. Accordingly, only this electronic device will be activated while the others will remain deactivated.

Each of the wake-up units will have a particular ID which may be based on the resonating frequency of its MEMS units.

As mentioned above, the remote control is adapted to generate wake-up signals at different frequencies. As each wake-up unit in the electronic device is tuned to a specific frequency, it will only be activated when it receives a wake-up signal at its frequency. Alternatively or additionally, several wake-up units may be provided in an electronic device each with a different wake-up resonating frequency. Optionally, one of these wake-up units will be present in each of the electronic devices and will be tuned to a specific wake-up signal frequency such that all devices are activated if a wake-up signal is received at this specific frequency.

Otherwise each electronic device will only be activated if its wake-up device has received a wake-up signal at its specific frequency.

Figure 5:
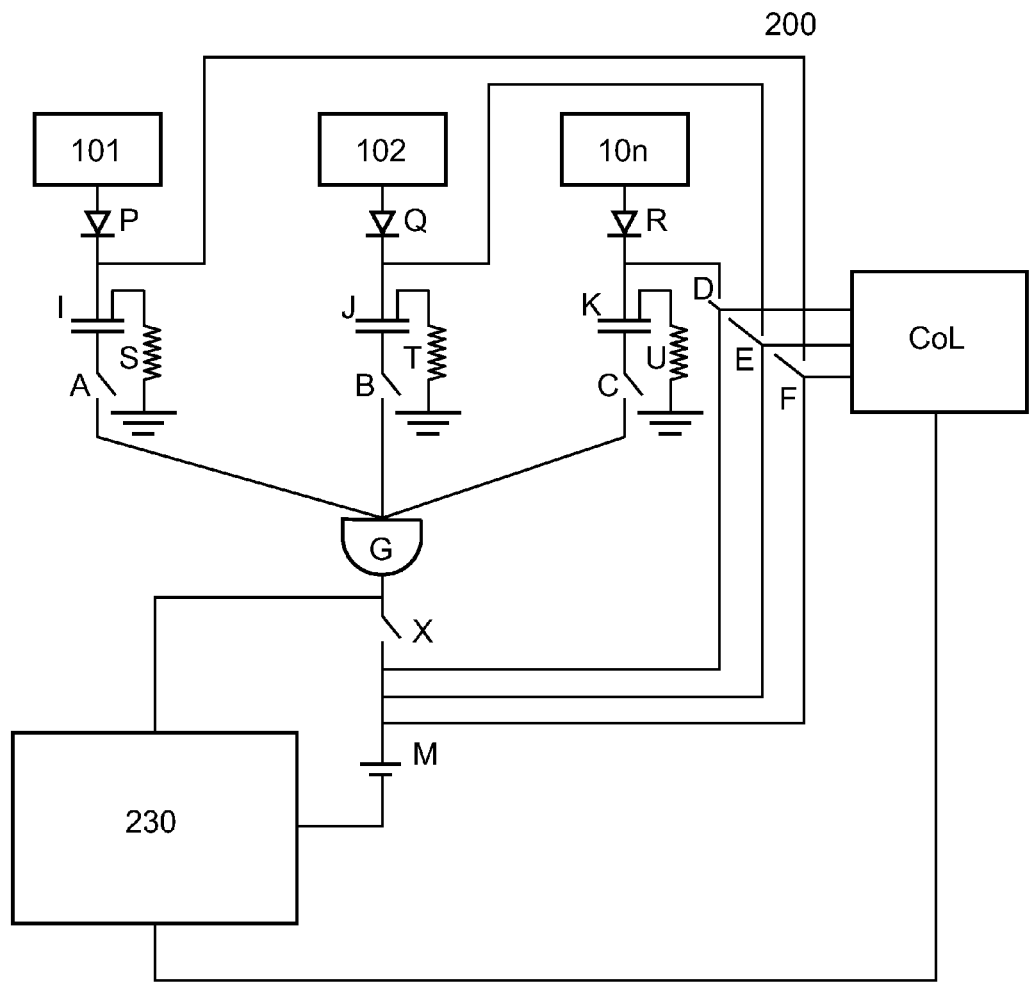
FIG. 5 shows a circuit diagram of an electronic device according to a fifth embodiment.

FIG. 5 shows a circuit diagram of an electronic device according to a fifth embodiment. The electronic device 200 comprises several wake-up units 101, 102, 100$n$. The electronic device 200 furthermore comprises functional and logic units 230 which can go into stand-by mode and thus require reactivation. The electronic device comprises three e.g. switches A, B and C each in series to one of the wake-up units 101, 102, 10$n$. The three switches have a default state which is the off-state. If one of the wake-up units 101-10$n$ starts to resonate as it has received a wake-up signal at a specific frequency, it will supply the generated current and the current will flow through the diodes P, Q or R and will charge up a capacitor I, J or K. The diodes P, R or Q are used to rectify the current. If sufficient charge has been accumulated in one of the capacitors I, J, K, the switch associated thereto will be closed and the AND gate G will receive a signal at a logic high. However, the AND gate G will only be activated if it receives a high signal from each of the switches, i.e. if all three switches are switched on. A further switch X is coupled in series to the gate G and its default state is the off state. When the output signal of the gate is high, the switch X is activated. In such a case a power source M will be connected to the function and logic units 230 of the electronic device which are then powered or activated and return to their normal operating state. If the function unit and logic units 230 are activated, they will output a signal to a cut-off logic COL, which is coupled to three further switches D, E and F in order to set the switches in an on-state. Accordingly, a current will flow via the capacitors I, J, K and the switches A, B and C will remain in their closed state.

If the function unit and logic unit 230 of the electronic device are to be switched off, they will send a switch off signal to the cut off logic COL. In response to the off signal, the cut off logic COL will open the switches D, E and F such that the capacitors I, J and K will be discharged via their corresponding resistors R, T or U. Hence, the switches A, B and C will be opened and the switch X will be opened as well such that the function units and logic units 230 of the electronic device will be disconnected from their power source M.

If the capacitors I, J and K will be charged up randomly, this charge can be discharged via the resistors S, T and U as long as the wake-up units do not resonate.

Accordingly, the current generated by the wake-up units can be used to signal an electronic device to be activated. Alternatively, the currents generated by the wake-up unit can be accumulated in a capacitor and the accumulated charge can be discharged to signal an electronic device to be activated.

The wake-up unit according to the invention can be used in any kind of electronic device which can be switched into a stand-by mode. Therefore, the wake-up units according to the invention can be used in consumer systems, computer networks and other electronic devices.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An apparatus for waking up an electronic device, comprising:
   a wake-up unit, including:
      a resonating unit configured and arranged to resonate, in response to acoustic excitation provided by a sonic wake-up signal, indicating a request to enable the electronic device, in at least one specific frequency,
      at least one first electrode,
      at least one piezoelectric material, and
      at least one second electrode,
      wherein the piezoelectric material is sandwiched between the at least one first electrode and the at least one second electrode, and is configured and arranged to provide an electrical current to the at least one first electrode and to the at least one second electrode in response to resonation of the resonating unit at the at least one specific frequency.

2. The apparatus according to claim 1, wherein:
   the apparatus further includes a remote control unit configured and arranged to transmit the sonic wake-up signal to the wake-up unit in response to input indicating the request to enable the electronic device; and
   the resonating unit includes a cantilever which resonates when it receives the sonic wake-up signal at the at least one specific frequency, and the sonic wake-up signal is an ultra sound.

3. The apparatus according to claim 1, wherein:
   the wake-up unit is configurable to operate in a system including a remote control unit configured to transmit the sonic wake-up signal in response to a first input; and
   the resonating unit includes a plurality of cantilevers which each resonate in response to a sonic signal having a frequency that is different than a sonic signal frequency at which the other ones of the cantilevers resonate, such that one of the at least one first electrode and one of the at least one second electrode provides an electrical current.

4. The apparatus according to claim 1, wherein the resonating unit, the at least one first electrode, the at least one piezoelectric material and the at least one second electrode are implemented as a micro-electromechanical system (MEMS).

5. An electronic device, including at least one wake-up unit according to claim 1, wherein the electronic device is configured and arranged to switch between a stand-by mode and an active-mode in response to the current generated by the wake-up unit.

6. A method for waking up an electronic device having a wake-up unit which comprises a resonating unit, at least one first electrode, at least one piezoelectric material and at least one second electrode, wherein the piezoelectric material is sandwiched between the at least one first and at least one second electrode, comprising the steps of:
   at the wake up unit:
      receiving a sonic wake-up signal, indicating a request to enable the electronic device, in at least one specific frequency,
      resonating the resonating unit at the at least one frequency in response to acoustic excitation provided in response to the sonic wake-up signal, and
      providing an electrical current to the at least one first and the at least one second electrode, in response to the resonating unit resonating at the at least one frequency.

7. The method according to claim 6, further including providing the sonic wake-up signal to the wake-up unit by emitting an ultra-sound wake-up signal from a remote control device.

8. The method according to claim 6, further including utilizing the current generated by the wake-up unit to activate the electronic device.

9. The apparatus according to claim 3, wherein the at least one first electrode, piezoelectric material and second electrode include, for each of the plurality of cantilevers, a first electrode, piezoelectric material and a second electrode configured and arranged to generate electrical current in response to the cantilever resonating, and
   each resonator/piezoelectric material combination thereby providing electrical current corresponding to the application of a sonic wake-up signal at a particular resonant frequency that is different than a resonant frequency at which the other resonator/piezoelectric material combinations provide electrical current.

10. An apparatus comprising:
    a wake-up unit, configured and arranged to receive a sonic signal indicating a request to enable an electronic device, the wake-up unit including
       a resonating unit configured and arranged to resonate in at least one specific frequency in response to acoustic excitation provided by the sonic signal; and
       a piezoelectric unit including a top electrode, a bottom electrode and a piezoelectric material between the top and bottom electrodes, the piezoelectric unit being configured and arranged to generate current in response to resonation of the at least one resonating unit; and
    wherein the electronic device is coupled to the at least one wake-up unit and is configured and arranged to activate in response to the current generated by the at least one piezoelectric unit by switching from a stand-by mode to an active-mode.

11. The apparatus according to claim 10, further including a plurality of the wake-up units, each wake-up unit having a resonating unit configured and arranged to resonate at a specific frequency that is different than a specific frequency at which the resonating units of the other wake-up unit resonate.

12. The apparatus according to claim 11, further including a plurality of the electronic devices, each of the electronic devices being connected to receive the generated current from one of the plurality of associated wake-up units, the wake-up units thereby operating the electronic devices based upon the frequency of a sonic signal provided to the apparatus.

13. The apparatus according to claim 12, further comprising a remote control configured and arranged to generate sonic signals at each of the respective resonant frequencies to individually switch the electronic devices from the stand-by mode to the active-mode.

14. The method according to claim 6, further comprising: dampening the acoustic excitation in the resonating unit in response to an absence of the sonic signal.

15. The apparatus according to claim 1, wherein the resonating unit is further configured to dampen the acoustic excitation in the resonating unit in response to an absence of the sonic signal.

* * * * *